United States Patent
Uetani et al.

(10) Patent No.: US 8,163,085 B2
(45) Date of Patent: Apr. 24, 2012

(54) METHOD AND APPARATUS FOR FORMING PROTECTIVE LAYER

(75) Inventors: Kazuo Uetani, Osaka (JP); Kaname Mizokami, Osaka (JP); Yoshinao Ooe, Kyoto (JP); Akira Shiokawa, Osaka (JP); Hiroyuki Kado, Osaka (JP)

(73) Assignee: Panasonic Corporation, Osaka (JP)

( * ) Notice: Subject to any disclaimer, the term of this patent is extended or adjusted under 35 U.S.C. 154(b) by 970 days.

(21) Appl. No.: 11/665,019

(22) PCT Filed: Sep. 11, 2006

(86) PCT No.: PCT/JP2006/017965
§ 371 (c)(1),
(2), (4) Date: Apr. 10, 2007

(87) PCT Pub. No.: WO2007/032302
PCT Pub. Date: Mar. 22, 2007

(65) Prior Publication Data
US 2009/0017189 A1 Jan. 15, 2009

(30) Foreign Application Priority Data

Sep. 13, 2005 (JP) .................................. 2005-264978
Aug. 28, 2006 (JP) .................................. 2006-230061

(51) Int. Cl.
*C30B 25/00* (2006.01)

(52) U.S. Cl. .................. 117/88; 117/84; 117/85; 117/86
(58) Field of Classification Search .................... 117/84, 117/85, 86, 88
See application file for complete search history.

(56) References Cited

U.S. PATENT DOCUMENTS

| 4,975,168 | A | 12/1990 | Ohno et al. | |
| 6,150,030 | A | 11/2000 | Stollenwerk et al. | |
| 2002/0034917 | A1* | 3/2002 | Tanaka et al. | 445/24 |
| 2006/0003086 | A1* | 1/2006 | Takase | 427/64 |
| 2006/0003087 | A1* | 1/2006 | Takase et al. | 427/64 |

FOREIGN PATENT DOCUMENTS

| JP | 9-295894 | 11/1997 |
| JP | 10-106441 | 4/1998 |
| JP | 11-312469 | 11/1999 |
| JP | 2002-33053 | 1/2002 |
| JP | 2002-69617 | 3/2002 |
| JP | 2003-297237 | 10/2003 |
| JP | 2004-31264 | 1/2004 |
| JP | 2005-050804 | 5/2005 |

OTHER PUBLICATIONS

European Search Report issued in European Patent Application No. EP 06797791.8 dated Nov. 11, 2010.

* cited by examiner

*Primary Examiner* — Matthew Song
(74) *Attorney, Agent, or Firm* — McDermott Will & Emery LLP (57) ABSTRACT

An apparatus for forming a protective layer of magnesium oxide on a front glass substrate (11) in an evaporation chamber (201) includes the following: oxygen outlet openings (222) for introducing oxygen into the evaporation chamber (201); water vapor outlet openings (210) for introducing water vapor into the evaporation chamber (201) from the downstream side in the transfer direction of the front glass substrate (11); a mass analyzer (224) for measuring the ionic strength of hydrogen and the ionic strength of oxygen in the evaporation chamber (201); and mass flow controllers (215) and (221) for controlling the introduction amount of the water vapor and the introduction amount of the oxygen, respectively, by the ionic strengths measured by the mass analyzer (224).

5 Claims, 6 Drawing Sheets

Distance between the substrate and
the water vapor outlet openings (mm)

FIG. 6

METHOD AND APPARATUS FOR FORMING PROTECTIVE LAYER

RELATED APPLICATIONS

This application is the U.S. National Phase under 35 U.S.C. §371 of International Application No. PCT/JP2006/317965, filed on Sep. 11, 2006, which in turn claims the benefit of Japanese Application Nos. 2005-264978 filed on Sep. 13, 2005 and 2006-230061 filed Aug. 28, 2006, the disclosures of which applications are incorporated by reference herein.

TECHNICAL FIELD

The present invention relates to a method and apparatus for forming a protective layer on a glass substrate, and more particularly to formation of a magnesium oxide (MgO) protective layer which protects a dielectric layer formed on the front glass substrate of a plasma display panel.

BACKGROUND ART

Plasma display panels (hereinafter, PDPs) are attracting attention as large-screen display devices because of their high-speed display and easiness of size expansion compared to liquid crystal panels. There has been an increasing development toward higher display quality such as higher definition and higher luminance, and improved reliability.

An AC surface-discharge type PDP generally has a three-electrode structure in which two glass substrates, a front panel and a back panel, are oppositely disposed with a predetermined space therebetween. The front panel includes one of the two glass substrates; display electrodes; a dielectric layer; and a protective layer. The display electrodes consist of scan electrodes and sustain electrodes that are formed in a stripe pattern on the glass substrate. The dielectric layer coats the display electrodes so as to function as a capacitor to store electric charges. The protective layer is about 1 μm thick and formed on the dielectric layer. On the other hand, the back panel includes address electrodes formed on the other glass substrate; an base dielectric layer that coats the address electrodes; barrier ribs formed on the base dielectric layer; and phosphor layers that are applied in display cells formed by the barrier ribs so as to emit red, green, and blue light.

The front panel and the back panel are air-tight sealed with their electrode bearing sides opposed to each other. The barrier ribs form a discharge space filled with a discharge gas containing neon and xenon at a pressure of 400 Torr to 600 Torr. The display electrodes are selectively applied with a video signal voltage so as to discharge a discharge gas. The discharge gas generates ultraviolet light which excites the phosphor layers, allowing them to emit red, green, and blue light so as to display color images.

The protective layer is made of a material highly resistant to sputtering by ion impact so as to protect the dielectric layer from ion sputtering in a discharge. The protective layer functions to emit secondary electrons from its surface so as to reduce the driving voltage at which the discharge gas is discharged. Because of these characteristics, the protective layer is made of a single crystal magnesium oxide (MgO) by using vacuum thin-film coating technology.

The protective layer, however, becomes thinner and changes its secondary-emission characteristics due to ion impact as the lighting time of the PDP gets longer. As a result, a time delay (discharge delay) occurs before generating a discharge after applying a voltage to the display electrodes. This delay causes flickering on the display screen, resulting in significant deterioration of display quality.

Figure 6:
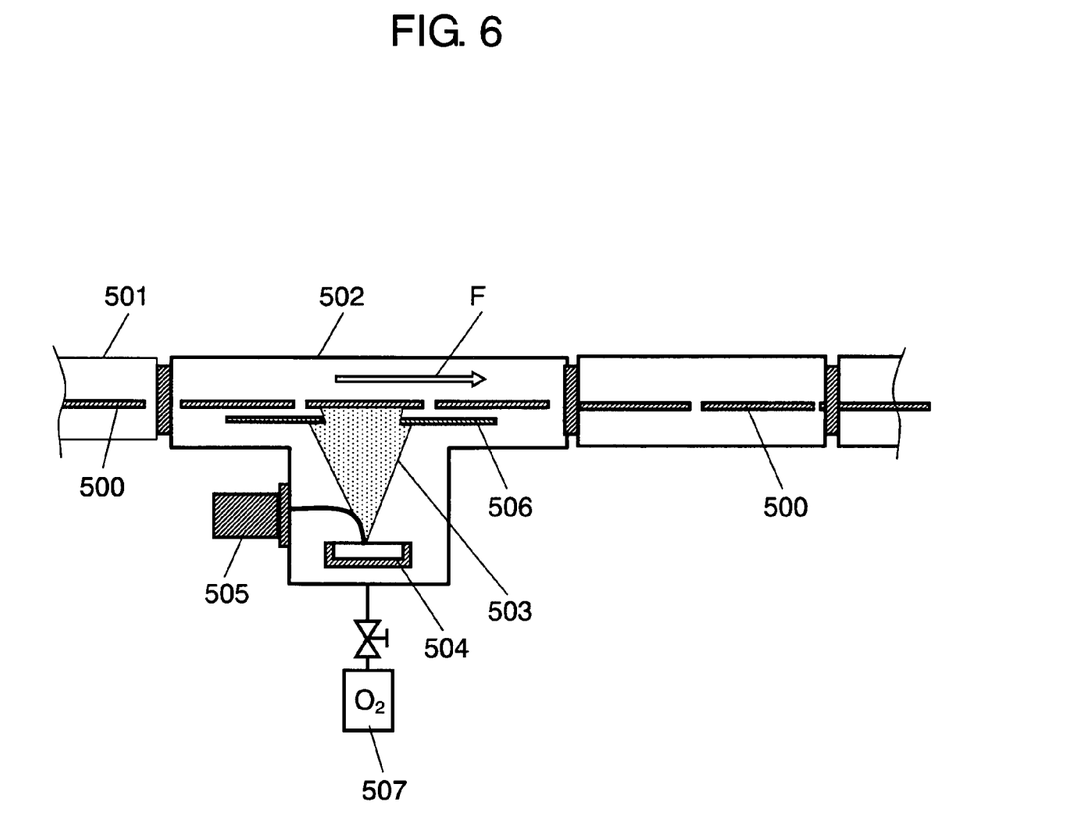
FIG. 6 is a schematic view of a conventional apparatus for forming a protective layer.

The MgO protective layer can have different crystal compositions depending on the manufacturing method, and therefore can change the discharge delay time, and the display quality and lifetime of the PDP. FIG. 6 is a schematic view of a conventional apparatus for forming a protective layer. The following is a conventional method for forming a MgO protective layer with reference to FIG. 6. First, substrate 500 made of high strain-point glass or the like is preheated in preheating chamber 501 and transferred into film-forming chamber 502 in the direction of arrow "F". In film-forming chamber 502, substrate 500 preheated to about 300° C. is exposed to vapor 503 of evaporated MgO particles blowing from below so as to form a MgO thin film on the surface of substrate 500. Vapor 503 is generated by irradiating an electron beam from Pierce-type electron gun 505 to MgO particle aggregates, which are an evaporation material placed in evaporation source 504 so as to melt and evaporate the MgO. There are provided baffle plates 506 between substrate 500 and evaporation source 504 so as to allow vapor 503 to be formed on the necessary portions of substrate 500.

The application of the electron beam to the MgO particle aggregates used as the evaporation material causes the MgO to decompose, allowing O atoms to escape. As a result, the formed MgO film lacks oxygen. In an attempt to make the composition ratio of the formed MgO film as close to the stoichiometric ratio as possible, oxygen is introduced using oxygen tank 507 or the like. However, the amount and method of introducing oxygen can greatly change the MgO characteristics.

In recent years, PDPs have been demanded to have higher-rate discharge characteristics in line with their improved definition. This makes it an urgent task to reduce the discharge delay due to the MgO composition. The task of reducing the discharge delay has been addressed as follows. In Japanese Patent Unexamined Publication No. 2003-297237, a change is made to the incident angle of evaporated particles. In Japanese Patent, Unexamined Publication No. 2004-031264, Ge or Si is added to MgO used as the evaporation material. In Japanese Patent Unexamined Publication No. 2002-33053, a MgO thin film is formed while being heated in an atmosphere containing hydrogen in an excited or ionized state so as to have sufficiently high sputtering resistance.

In these days, however, display devices have been demanded to have much higher definition and much higher-quality images, making it essential for PDPs to provide high-rate address discharge. When a discharge delay occurs in such a high-rate address discharge, it results in degradation of display quality such as dark defect or lighting failure. On the other hand, when the address time is extended to avoid the discharge delay, it reduces the sustain discharge time, thereby inevitably causing a deterioration in luminance and gradation. Therefore, it is crucial to minimize the discharge delay for the realization of Hi-Vision image display.

SUMMARY OF THE INVENTION

A method for forming a protective layer according to the present invention is a method for forming a protective layer of magnesium oxide while a substrate is being transferred in a film-forming chamber, the method including: introducing oxygen and water vapor into the film-forming chamber, the water vapor being introduced from a downstream side in a transfer direction of the substrate; measuring the ionic strength of hydrogen and the ionic strength of oxygen in the film-forming chamber; and controlling the introduction amount of the water vapor and the introduction amount of the oxygen by the ratio of the ionic strength of the hydrogen to the ionic strength of the oxygen.

This method for forming a protective layer can manufacture a protective layer causing only a short discharge delay, thereby realizing a PDP that provides excellent display quality in the case of Hi-Vision image display.

REFERENCE MARKS IN THE DRAWINGS

1 PDP
10 front panel
11 front glass substrate
12 display electrode
12a scan electrode
12b sustain electrode
13 black stripe
14 dielectric layer
15 protective layer
20 back panel
21 back glass substrate
22 address electrode
23 base dielectric layer
24 barrier rib
25 phosphor layer
30 discharge space
200 preheating chamber
201 evaporation chamber (film-forming chamber)
202 annealing chamber
203, 204 gate valve
205 evaporation source (film-forming source)
206 MgO vapor
207 Pierce-type electron gun
208 electron beam
209 baffle plate
210 water vapor outlet opening
211 discharge pipe
212 hole
213 pure water
214 container
215, 221 mass flow controller
216 constant temperature bath
217 brine
218 temperature sensor
219 controller
220 oxygen tank
222 oxygen outlet opening
223 turbo pump
224 mass analyzer
225 measurement board
226 computer
230 water vapor
240 water vapor pipe

DETAILED DESCRIPTION OF PREFERRED EMBODIMENT

An embodiment of the present invention is described as follows with reference to drawings.

(Exemplary Embodiment)

Figure 1:
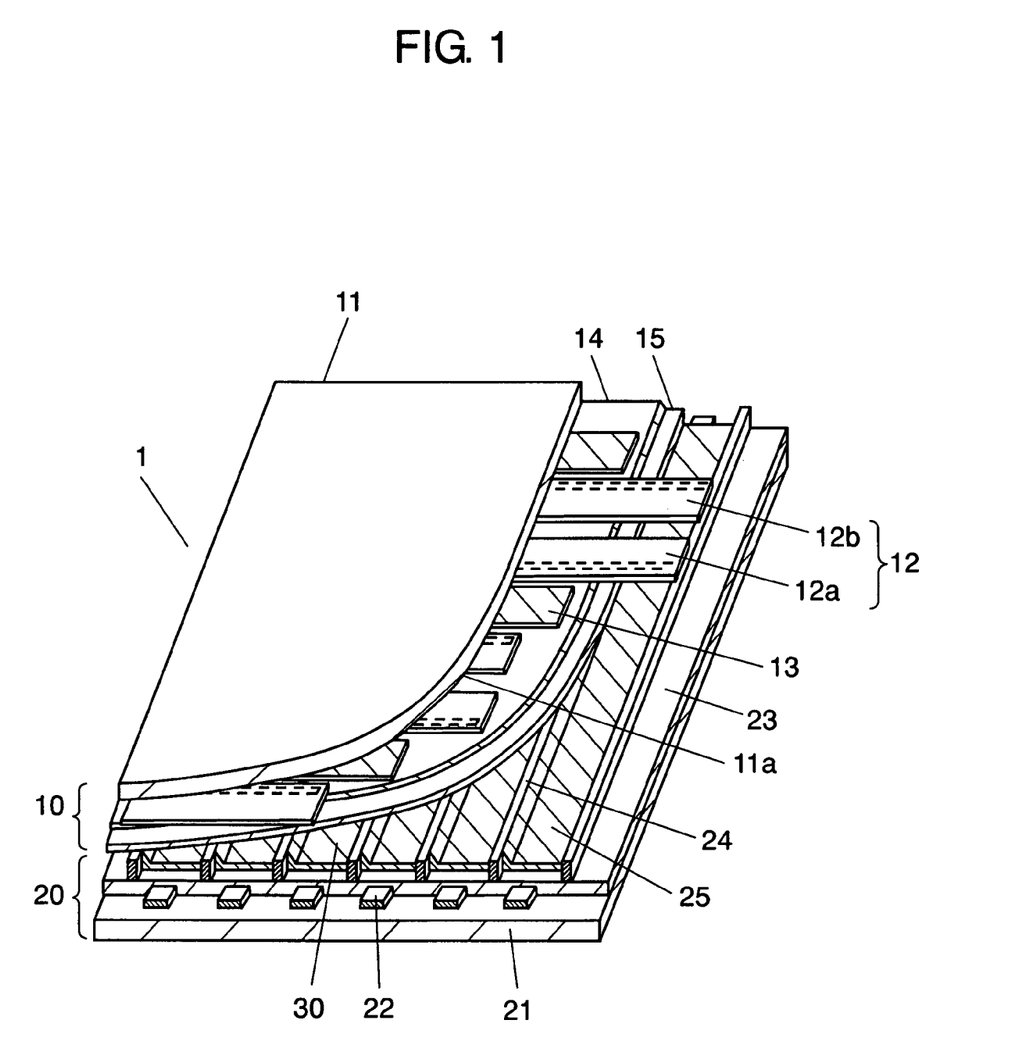
FIG. 1 is a perspective view showing a schematic configuration of a PDP.

The following is a description of the configuration of a PDP provided with a protective layer manufactured using the method and apparatus for forming a protective layer according to the present invention. FIG. 1 is a perspective view showing a schematic configuration of the PDP. As shown in FIG. 1, PDP 1 includes front panel 10 and back panel 20 disposed opposite to each other. Front panel 10 includes front glass substrate 11 and display electrodes 12 formed thereon. Display electrodes 12 consist of a plurality of pairs of scan electrodes 12a and sustain electrodes 12b that are formed in a stripe pattern. Display electrodes 12 have black stripes 13 therebetween in such a manner that display electrodes 12 and black stripes 13 are arranged alternately with each other. Scan electrodes 12a, sustain electrodes 12b, and black stripes 13 are coated thereon with dielectric layer 14, which is further coated thereon with protective layer 15 of MgO.

Back panel 20, on the other hand, includes back glass substrate 21 and address electrodes 22 formed thereon in a stripe pattern and at right angles to scan electrodes 12a and sustain electrodes 12b. Address electrodes 22 are coated thereon with base dielectric layer 23, which functions to protect address electrodes 22 and reflects visible light to front panel 10. There are provided, on base dielectric layer 23, barrier ribs 24 arranged in the same direction as address electrodes 22 in such a manner as to sandwich address electrodes 22. There are also provided phosphor layers 25 between barrier ribs 24.

Front panel 10 and back panel 20 are disposed opposite to each other and sealed at their periphery with a sealing member (unillustrated) so as to form discharge space 30.

Discharge space 30 contains cells formed between adjacent barrier ribs 24, and each cell performs image display in the region formed by a pair of adjacent display electrodes 12 and one of address electrodes 22. Discharge space 30 is filled with a discharge gas such as a mixture of neon (Ne) and xenon (Xe) at a pressure of 53200 Pa (400 Torr) to 79800 Pa (600 Torr).

In PDP 1 thus structured, a pulse-like voltage is applied between each pair of scan electrode 12a and sustain electrode 12b so as to discharge a discharge gas in discharge space 30. The discharge gas generates ultraviolet light, which is irradiated to phosphor layers 25. In this manner, phosphor layers 25 of three colors emit visible light and allow the light to pass through the surface of front panel 10, thereby realizing color image display.

Protective layer 15 is made of a material highly resistant to sputtering by ion impact so as to protect dielectric layer 14 from ion sputtering in a discharge. Protective layer 15 functions to emit secondary electrons from its surface so as to reduce the driving voltage at which the discharge gas is discharged.

Figure 2:
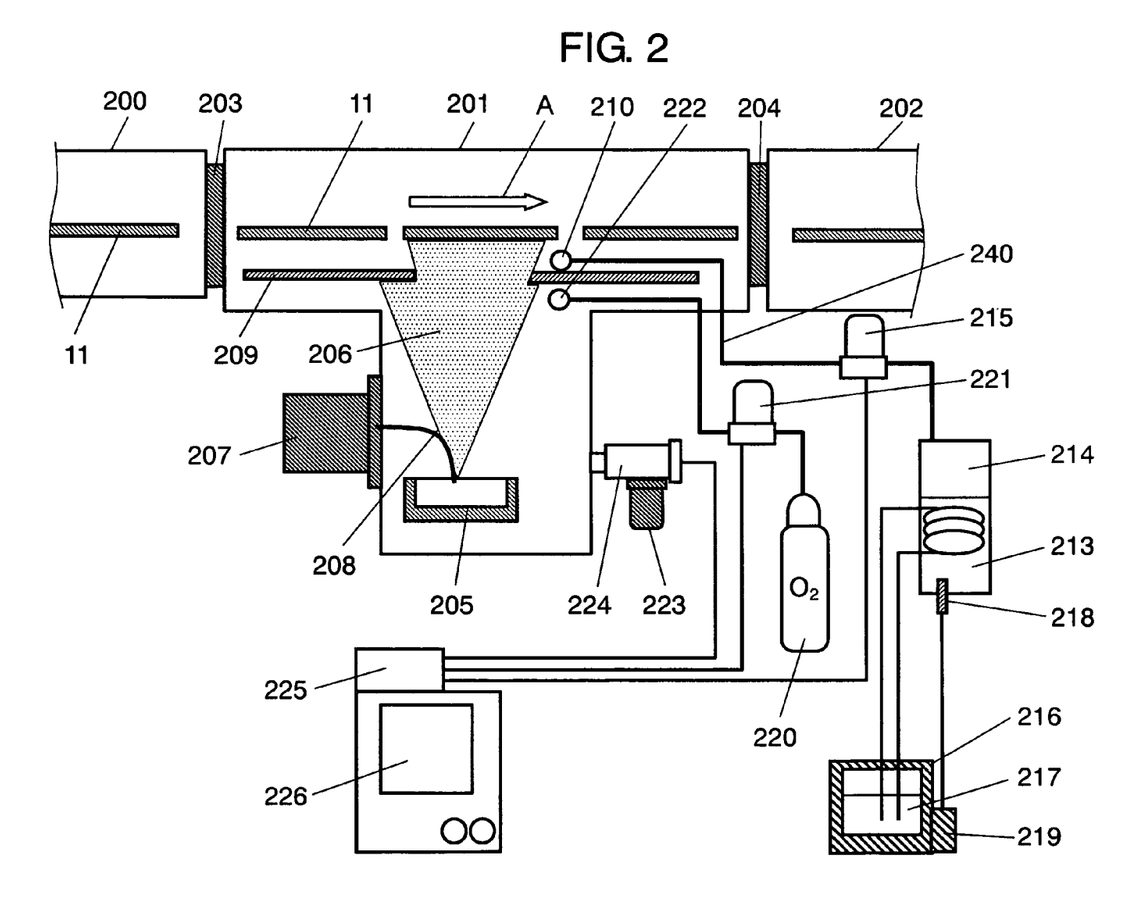
FIG. 2 shows the configuration of an apparatus for forming a protective layer according to an embodiment of the present invention.

FIG. 2 shows the configuration of the apparatus for forming a protective layer according to the embodiment of the present invention. The apparatus for forming a protective layer includes a substrate transfer system and an evaporation system. In the substrate transfer system, front glass substrate 11 that is finished up to dielectric layer 14 of front panel 10 of PDP 1 is transferred in the direction of arrow "A" in the following order: preheating chamber 200, evaporation chamber 201 as the film-forming chamber, and annealing chamber 202. Preheating chamber 200, evaporation chamber 201, and annealing chamber 202 are evacuated inside. Front glass substrate 11 can be transferred thereinto by opening gate valve 203 or 204.

In evaporation chamber 201, protective layer 15, which is a thin MgO film, is formed on dielectric layer 14 of front glass substrate 11 by MgO vapor 206 evaporated from evaporation source 205. Evaporation source 205 is provided as a film-forming source below evaporation chamber 201 of the evaporation system. MgO vapor 206 is generated by irradiating electron beam 208 from Pierce-type electron gun 207 to particle aggregates of MgO crystals placed in evaporation source 205 so as to heat and evaporate the particle aggregates. There are provided baffle plates 209 between evaporation source 205 and front glass substrate 11 so that MgO vapor 206 can be applied to a predetermined region of front glass substrate 11 where the MgO thin film is to be formed. Baffle plates 209 also control the incident angle of the vapor from evaporation source 205 to front glass substrate 11.

Figure 3A:
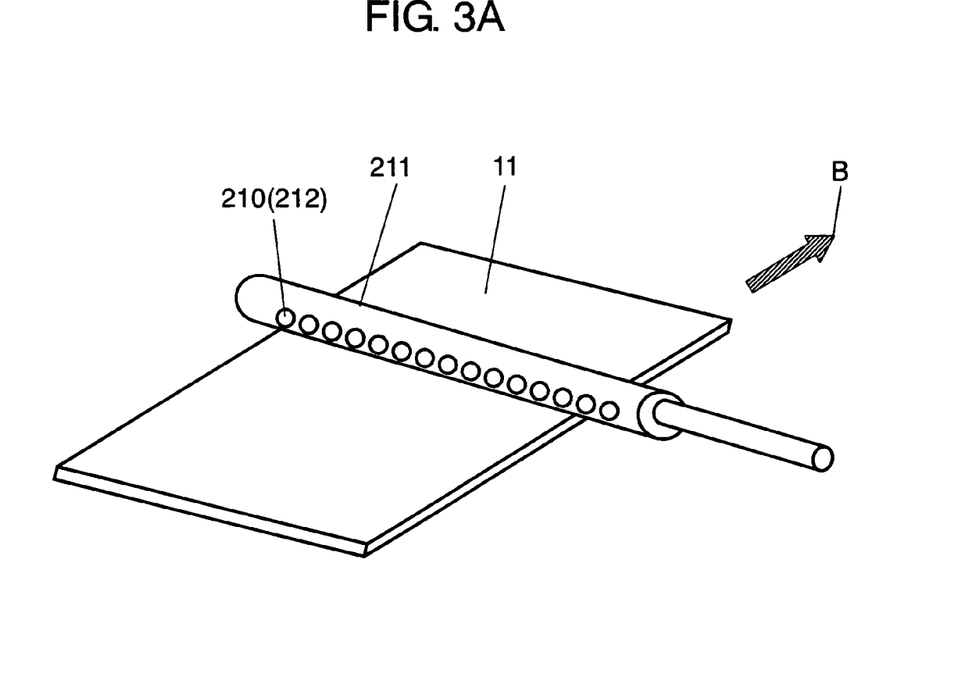
FIG. 3A is a perspective view showing the arrangement of water vapor outlet openings and a front glass substrate in the apparatus for forming a protective layer according to the embodiment of the present invention.
Figure 3B:
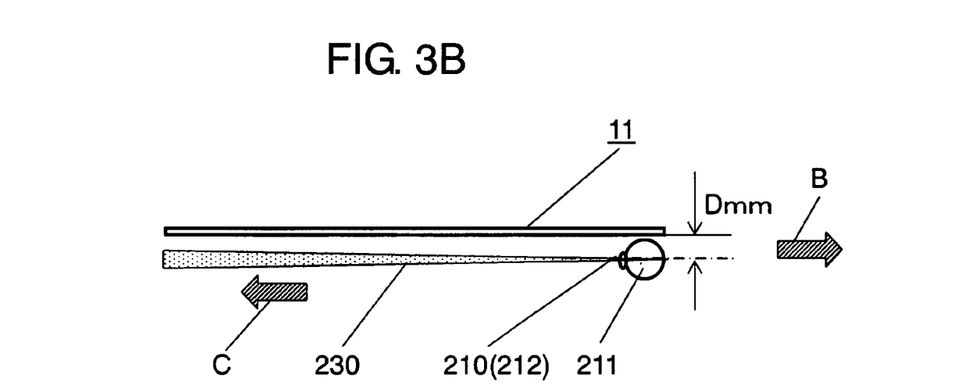
FIG. 3B is a side view showing the arrangement of the water vapor outlet openings and the front glass substrate in the apparatus for forming a protective layer according to the embodiment of the present invention.

In the embodiment of the present invention, there are provided water vapor outlet openings 210 between baffle plates 209 and front glass substrate 11 that is traveling. Water vapor outlet openings 210 are a component of a water vapor introduction part which introduces water vapor into evaporation chamber 201. FIGS. 3A and 3B show the arrangement of water vapor outlet openings 210 and front glass substrate 11 as a perspective view and a side view, respectively.

As shown in FIG. 3A, water vapor outlet openings 210 are a large number of holes 212 perforated in discharge pipe 211 which discharges water vapor flowing from a steam generator connected to discharge pipe 211. Holes 212 are arranged substantially in parallel with front glass substrate 11. As shown in FIG. 3B, front glass substrate 11 is transferred in the direction of arrow "B". At the same time, water vapor 230 blowing from holes 212 is introduced into evaporation chamber 201 in the direction of arrow "C" along the surface of front glass substrate 11 that is to be provided with the protective layer. The direction of arrow "C" is against the direction of arrow "B" in which to transfer front glass substrate 11. As shown in FIG. 3B, water vapor outlet openings 210 are open to evaporation chamber 201 with distance "D" from the surface of front glass substrate 11 that is to be provided with the protective layer. As described above with reference to FIGS. 3A and 3B, the provision of the plurality of holes 212 from which to blow water vapor 230 along the surface of front glass substrate 11 allows water vapor 230 to be applied evenly and extensively to front glass substrate 11.

On the other hand, as shown in FIG. 2, water vapor 230 is generated in container 214 containing pure water 213. Container 214 is another component of the water vapor introduction part and functions as a steam generator. The introduction amount of water vapor 230 is controlled by mass flow controller 215, which is a vapor introduction controller. The temperature of container 214 is controlled by brine 217 circulated through constant temperature bath 216. The temperature of brine 217 is controlled to be a predetermined value by providing the temperature information of temperature sensor 218 to controller 219. Keeping the temperature of pure water 213 constant can keep the water vapor pressure constant so as to control mass flow controller 215 in a stable manner.

Furthermore, oxygen is supplied using oxygen tank 220 as a component of an oxygen introduction part, and the introduction amount of oxygen is controlled by mass flow controller 221, which is an oxygen introduction controller. The oxygen is then introduced into evaporation chamber 201 through oxygen outlet openings 222, which are another component of the oxygen introduction part.

Container 214, a component of the water vapor introduction part, functions as the steam generator, and mass flow controller 215 which functions as the water vapor introduction controller to control the introduction amount of the water vapor are disposed on the downstream side in the transfer direction of front glass substrate 11 and outside evaporation chamber 201. In the embodiment of the present invention, the vapor generation is controlled by the temperature of brine 217, and the water vapor generated in container 214 is supplied to water vapor outlet openings 210 through water vapor pipe 240. Therefore, it is necessary to control the temperature of water vapor pipe 240. In the embodiment of the present invention, as shown in FIG. 2, water vapor is blown through water vapor outlet openings 210 from downstream to upstream in the transfer direction of front glass substrate 11. In this manner, disposing container 214 and mass flow controller 215 outside evaporation chamber 201 and on the downstream side in the transfer direction of front glass substrate 11 can minimize the length of water vapor pipe 240 to supply water vapor. This facilitates thermal insulation and heating of water vapor pipe 240, thereby allowing the water vapor to be supplied in a stable manner.

The introduction amounts of oxygen and water vapor to evaporation chamber 201 are controlled based on the ratio of the ionic strength of oxygen to the ionic strength of hydrogen transmitted from mass analyzer 224, which is an ionic strength measuring device differentially evacuated by turbo pump 223. More specifically, the signal from mass analyzer 224 is A/D converted by measurement board 225 and transmitted to computer 226. Computer 226 transmits a control signal to each of mass flow controllers 215 and 221 based on the information so as to control the introduction amounts of oxygen and water vapor.

Mass analyzer 224 as a device for measuring the ionic strength in evaporation chamber 201 as the film-forming chamber is preferably disposed in the vicinity of evaporation source 205 as the film-forming source.

The reason for this is that monitoring how much is the influence of ionic strengths of hydrogen and oxygen on MgO vapor 206 evaporated from evaporation source 205 can facilitate to capture the effects of the quality of the protective layer.

A VGA PDP widely used at present requires a time of about 2 μs to 3 μs for address discharge. This means that a protective layer with a discharge delay time τs, which is about 500 ns to 600 ns at present, has a total discharge delay of 1.5 μs to 2 μs including a discharge formation delay τf, the total discharge delay being within the range of address time. On the other hand, Hi-Vision PDPs having double the number of scan lines than VGA PDPs are required to have a discharge delay time τs of not more than 300 ns or so.

Figure 4:
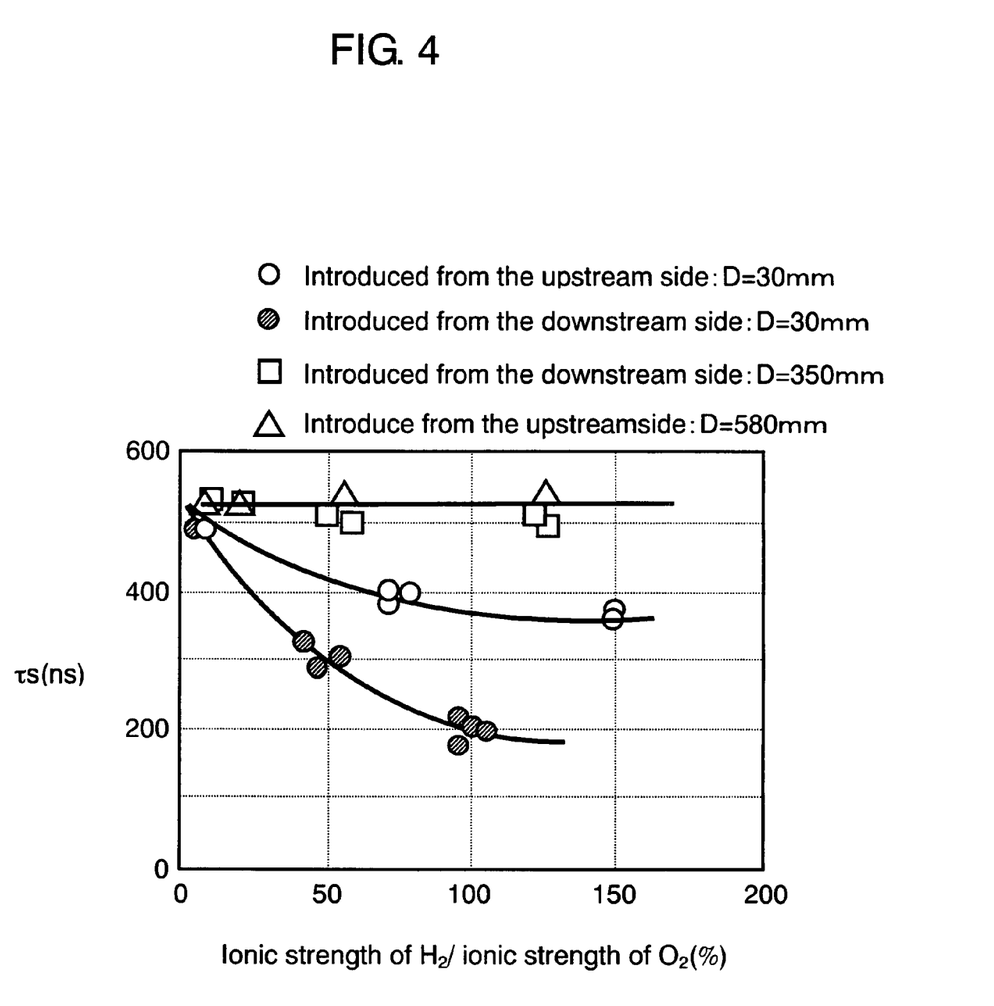
FIG. 4 is a graph showing measurement results of a discharge delay time of a protective layer manufactured using the method and apparatus for forming a protective layer according to the embodiment of the present invention.

FIG. 4 is a graph showing measurement results of a discharge delay time τs of a protective layer manufactured using the method and apparatus for forming a protective layer according to the embodiment of the present invention. In FIG. 4, the horizontal axis represents the ratio of the ionic strength of hydrogen (H2) to the ionic strength of oxygen (O2)in manufacturing the protective layer, and the vertical axis represents a discharge delay time τs in a PDP using the protective layer. The layout position of water vapor outlet openings 210 is shown as a parameter.

As apparent from FIG. 4, discharge delay time τs greatly varies depending on the ratio of the ionic strength of hydrogen to the ionic strength of oxygen in evaporation chamber 201. In the case where water vapor outlet openings 210 are disposed on the downstream side in the transfer direction of front glass substrate 11 at a distance of 30 mm from front glass substrate 11, discharge delay time τs can be not more than 300 ns when the ratio of the ionic strength of hydrogen/the ionic strength of oxygen is not less than 50%. In contrast, in the case where the distance between front glass substrate 11 and water vapor outlet openings 210 is 30 mm, but the water vapor is introduced from the upstream side in the transfer direction of front glass substrate 11, the decrease in discharge delay time τs is small compared to the ratio of the ionic strength of hydrogen/the ionic strength of oxygen. When the distance between front glass substrate 11 and water vapor outlet openings 210 is large, there is hardly any relation between the ratio of the ionic strength of hydrogen/the ionic strength of oxygen and discharge delay time τs.

Figure 5:
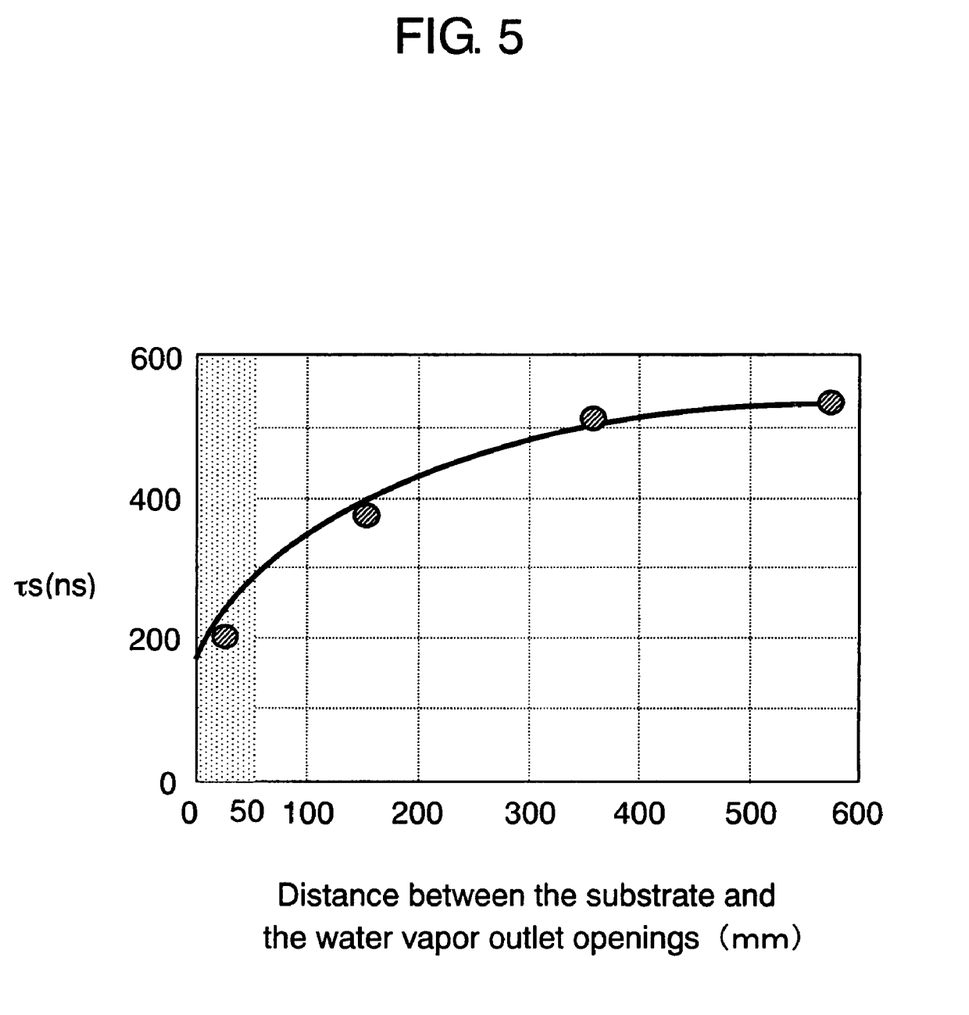
FIG. 5 is a graph showing the relation between the distance from the substrate to the water vapor outlet openings and the discharge delay time in the protective layer manufactured by the method and apparatus for forming a protective layer according to the embodiment of the present invention.

FIG. 5 is a graph showing the relation between the distance from the substrate to water vapor outlet openings 210 and discharge delay time τs in the case where water vapor 230 is introduced from the downstream side in the transfer direction of front glass substrate 11. The graph shows the measurement results when the ratio of the ionic strength of hydrogen/the ionic strength of oxygen is 75%. As apparent from FIG. 5, when the ratio of the ionic strength of hydrogen/the ionic strength of oxygen is 75%, discharge delay time τs can be not more than 300 ns by making distance D between front glass substrate 11 and water vapor outlet openings 210 not more than 50 mm.

As described above, discharge delay time τs of not more than 300 ns can be realized by setting distance D between the substrate and the water vapor outlet openings to not more than 50 mm and controlling the introduction amounts of water vapor and oxygen so as to make the ratio of the ionic strength of hydrogen/the ionic strength of oxygen not less than 75%. This results in a protective layer for PDPs providing excellent display quality in the case of Hi-Vision image display.

In the case where distance D between the substrate and the water vapor outlet openings is 30 mm, discharge delay time τs of not more than 300 ns can be realized by controlling the introduction amounts of vapor and oxygen so as to make the ratio of the ionic strength of hydrogen/the ionic strength of oxygen not less than 50%. The reason for the difference in effects depending on the position of the water vapor outlet openings relative to the substrate or to the transfer direction is considered as follows.

The vicinity of the substrate and downstream side in the transfer direction of the substrate corresponds to the time when the protective layer is just formed from the magnesium oxide. At this point in time, the magnesium oxide used as the protective layer is in a very active state, which means that oxygen atoms or magnesium atoms are in an unstable state with a large number of defective regions. Since the protective layer has a columnar structure in cross section, the large number of defective regions are present not only on its outermost surface but also on the interface between columnar MgO crystals.

In the case where the water vapor outlet openings are installed in the aforementioned position, the protective layer is exposed to the water vapor having a ratio of the ionic strength of hydrogen/the ionic strength of oxygen of not less than 50%, indicating a relatively large proportion of the ionic strength, of hydrogen. This ratio of ionic strength allows not only oxygen but also hydrogen to enter the defective regions so as to stabilize the protective layer. This seems to be the structure of the protective layer with small discharge delay time τs.

In contrast, it seems that in the case where the distance between the substrate and the water vapor outlet openings is large or where the water vapor outlet openings are on the upstream side in the transfer direction, the structure of the protective layer with small discharge delay time τs is not formed because the aforementioned phenomenon of stabilizing the protective layer does not occur.

In the present embodiment, the water vapor pipe is disposed perpendicular to the transfer direction and provided with a large number of water vapor outlet openings. The advantages of the present invention, however, can be obtained as long as there is provided a structure for supplying water vapor to the protective layer that is just formed, regardless of the numbers of the pipe and the water vapor outlet openings.

Also in the present embodiment, the water vapor introduction part is disposed only on the downstream side in the transfer direction of the substrate. Alternatively, an additional water vapor introduction part could be disposed either on the upstream side or in parallel to the transfer direction of the substrate so as to synergistically obtain the advantages of the present invention.

Furthermore, the film of magnesium oxide is formed by electron beam deposition in the present embodiment, but alternatively may be deposited by RF or DC sputtering or by a plasma gun so as to obtain the advantages of the present invention.

As described hereinbefore, the method and apparatus for forming a protective layer according to the present invention can provide a protective layer that can significantly reduce a discharge delay time, thereby realizing a high quality image with no defect even in the case of high-definition image display such as Hi-Vision. In addition to the reduction in the discharge delay time, the method and apparatus according to the invention can furthermore realize an increase in secondary electron emission rate and a reduction in sputtering rate of the protective layer. This results in an extension of the life of PDPs and a reduction in power consumption due to the reduced starting voltage.

Industrial Applicability

As described hereinbefore, the method and apparatus for forming a protective layer according to the present invention can form a high-quality, long-life protective layer as a PDP protective layer and therefore is useful in a method and apparatus for forming a large-screen display device.

The invention claimed is:

1. A method for forming a protective layer while a substrate is being transferred in a film-forming chamber, the method comprising:

introducing oxygen and water vapor into the film-forming chamber, the water vapor being introduced from a downstream side in a transfer direction of the substrate;

measuring an ionic strength of hydrogen and an ionic strength of oxygen in the film-forming chamber; and controlling an introduction amount of the water vapor and an introduction amount of the oxygen by a ratio of the ionic strength of the hydrogen to the ionic strength of the oxygen, wherein the water vapor is introduced into the film-forming chamber within 50 mm from the surface of the substrate, the surface being to be provided with the protective layer.

2. The method for forming a protective layer of claim 1, wherein the water vapor is introduced into the film-forming chamber along a surface of the substrate, the surface being to be provided with the protective layer.

3. The method for forming a protective layer of claim 1, wherein the film-forming chamber includes a film-forming source; and the ionic strength of the hydrogen and the ionic strength of the oxygen are measured in a vicinity of the film-forming source.

4. The method for forming a protective layer of claim 1, wherein the introduction amount of the oxygen and the introduction amount of the water vapor are controlled so that the ratio of the ionic strength of the hydrogen to the ionic strength of the oxygen is not less than 50%.

5. The method for forming a protective layer of claim 1, wherein said protective layer is made of magnesium oxide, said method further comprising:

introducing MgO vapor into the film-forming chamber.

\* \* \* \* \*